United States Patent
Isler et al.

(10) Patent No.: US 10,263,179 B2
(45) Date of Patent: Apr. 16, 2019

(54) METHOD OF FORMING TUNNEL MAGNETORESISTANCE (TMR) ELEMENTS AND TMR SENSOR ELEMENT

(71) Applicant: NXP B.V., Eindhoven (NL)

(72) Inventors: Mark Isler, Hamburg (DE); Klaus Reimann, Eindhoven (NL); Hartmut Matz, Hamburg (DE); Jörg Kock, Horst (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/652,311

(22) Filed: Jul. 18, 2017

(65) Prior Publication Data

US 2019/0027682 A1 Jan. 24, 2019

(51) Int. Cl.
| | | |
|---|---|---|
| *H01L 43/12* | (2006.01) | |
| *H01L 43/08* | (2006.01) | |
| *H01L 43/02* | (2006.01) | |
| *H01L 43/10* | (2006.01) | |

(52) U.S. Cl.
CPC ............ *H01L 43/08* (2013.01); *H01L 43/02* (2013.01); *H01L 43/10* (2013.01); *H01L 43/12* (2013.01)

(58) Field of Classification Search
CPC ......... H01L 43/08; H01L 43/10; H01L 43/02; H01L 43/12
See application file for complete search history.

(56) References Cited

U.S. PATENT DOCUMENTS

| | | | | |
|---|---|---|---|---|
| 6,473,337 | B1 * | 10/2002 | Tran | G11C 11/15 257/E27.005 |
| 8,716,818 | B2 * | 5/2014 | Yoshikawa | H01L 43/08 257/421 |
| 8,956,882 | B1 * | 2/2015 | Tomioka | H01L 43/12 438/3 |
| 9,502,640 | B1 * | 11/2016 | Annunziata | H01L 43/12 |
| 9,508,922 | B2 * | 11/2016 | Yoshikawa | H01L 43/08 |
| 9,647,200 | B1 * | 5/2017 | Annunziata | H01L 43/02 |
| 10,050,193 | B1 * | 8/2018 | Klebanov | H01L 43/12 |
| 2006/0007603 | A1 * | 1/2006 | Meguro | B82Y 10/00 360/320 |
| 2010/0020592 | A1 * | 1/2010 | Hosotani | G11C 11/161 365/158 |

(Continued)

FOREIGN PATENT DOCUMENTS

JP 2006060172 A 3/2006

*Primary Examiner* — Earl N Taylor
(74) *Attorney, Agent, or Firm* — Charlene R. Jacobsen

(57) ABSTRACT

A method includes performing an ion beam etching process on a tunnel magnetoresistance (TMR) stack to remove material portions of a first magnetic layer and a tunnel barrier layer of the TMR stack. The ion beam etching process stops at a top surface of a second magnetic layer of the TMR stack. A protective layer is deposited over the TMR stack. Another etch process is performed to remove the protective layer such that a portion of the second magnetic layer is exposed from the protective layer and a spacer is formed from a remaining portion of the protective layer. The spacer surrounds sidewalls of the first magnetic layer and the tunnel barrier layer. The portion of the second magnetic layer exposed from the protective layer is removed so that a TMR sensor element remains, where the TMR sensor element includes a bottom magnet, a top magnet, and a tunnel junction.

15 Claims, 6 Drawing Sheets

(56) References Cited

U.S. PATENT DOCUMENTS

| | | | |
|---|---|---|---|
| 2010/0117169 A1 | 5/2010 | Anderson et al. | |
| 2010/0155231 A1* | 6/2010 | Watanabe | B82Y 10/00 |
| | | | 204/192.34 |
| 2014/0170776 A1* | 6/2014 | Satoh | H01L 43/12 |
| | | | 438/3 |
| 2014/0308758 A1* | 10/2014 | Nemani | H01L 43/12 |
| | | | 438/3 |
| 2015/0069556 A1* | 3/2015 | Yamakawa | H01L 43/02 |
| | | | 257/421 |
| 2015/0249206 A1* | 9/2015 | Kim | H01L 43/08 |
| | | | 257/421 |
| 2015/0255507 A1* | 9/2015 | Pakala | H01L 43/12 |
| | | | 257/421 |
| 2016/0072050 A1* | 3/2016 | Yoshikawa | H01L 43/08 |
| | | | 257/421 |
| 2016/0163973 A1 | 6/2016 | Pinarbasi | |
| 2016/0196951 A1* | 7/2016 | Ohsawa | H01J 37/30 |
| | | | 250/492.3 |
| 2016/0225981 A1 | 8/2016 | Deshpande et al. | |
| 2016/0308112 A1* | 10/2016 | Tan | H01L 41/47 |
| 2017/0047510 A1* | 2/2017 | Chen | H01L 43/08 |
| 2017/0076769 A1* | 3/2017 | Shirotori | G11C 11/161 |
| 2017/0263860 A1* | 9/2017 | Seto | H01L 27/228 |

* cited by examiner

PRIOR ART

METHOD OF FORMING TUNNEL MAGNETORESISTANCE (TMR) ELEMENTS AND TMR SENSOR ELEMENT

TECHNICAL FIELD OF THE INVENTION

The present invention relates generally to magnetic field sensors. More specifically, the present invention relates to tunnel magnetoresistance (TMR) sensor elements and robust TMR sensor element fabrication methodology.

BACKGROUND OF THE INVENTION

Magnetic field sensor systems are utilized in a variety of commercial, industrial, and automotive applications to measure magnetic fields for purposes of speed and direction sensing, angular sensing, proximity sensing, and the like. Magnetic field sensors may be based on semiconductor materials (e.g., Hall sensors, magnetoresistors, and so forth) and ferromagnetic materials (e.g., ferromagnetic magnetoresistors and flux guides). Other magnetic field sensors may utilize optical, resonant, and superconducting properties.

Tunnel magnetoresistance (TMR) sensor elements exploit a magnetoresistive effect that occurs in a magnetic tunnel junction (MTJ) structure. An MTJ structure includes a metal-insulator-metal layer sandwich in which the metal layers are ferromagnetic and the insulator layer is very thin. Electrically, this forms a tunnel diode in which electrons can tunnel from one ferromagnet into the other. Such a tunnel diode exhibits transport characteristics that depend, not only on the voltage bias, but also on the magnetic states of the top and bottom ferromagnetic layers.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns tunnel magnetoresistance (TMR) sensor element fabrication methodology and TMR sensor elements fabricated utilizing the methodology. More particularly, the method of fabrication entails a nitride or oxide spacer technique to protect the magnetic tunnel junction (MTJ) structure during etching processes. The fabrication methodology may achieve a robust and high yield process that enables production of very different magnetic stacks without the addition of further process steps, for improved magnetic sensor performance, reliability, cost savings, and so forth.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
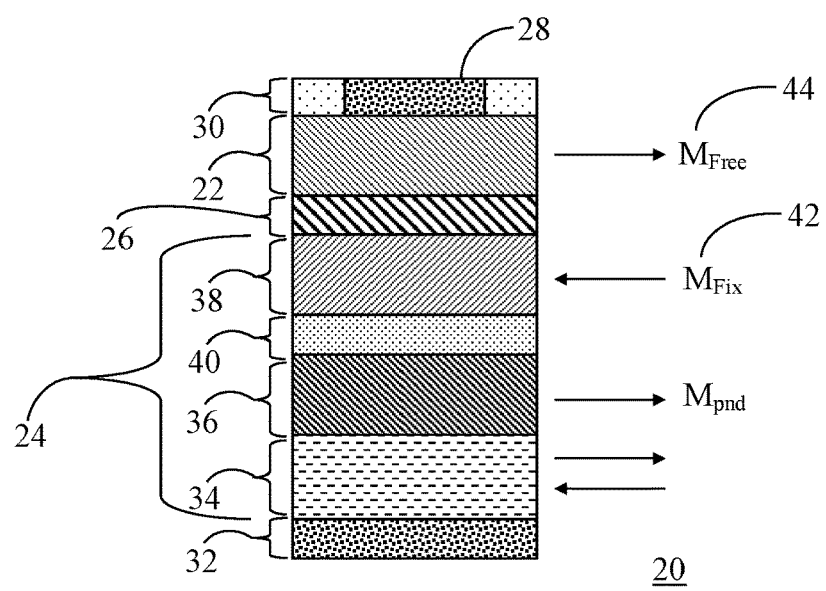
FIG. 1 shows a simplified side view of an example of a tunnel magnetoresistance (TMR) sensor element.

Referring to FIG. 1, FIG. 1 shows a simplified side view of an example of a tunnel magnetoresistance (TMR) sensor element 20. More particularly, TMR sensor element 20 is an MTJ structure that includes magnetic layers 22, 24 separated by an insulator layer, referred to herein as a tunnel junction 26. An electrode 28 embedded within, for example, a dielectric material 30, may be in electrical communication with magnetic layer 22. Electrode 28 is referred to herein as a top electrode 28. Another electrode, referred to herein as a bottom electrode 32, may be in electrical communication with magnetic layer 24.

In this example, magnetic layer 22 may be a free layer and magnetic layer 24 may be a reference layer with a reference magnetization. In some configurations, the reference magnetization of the reference magnetic layer, e.g., magnetic layer 24, may be generated by a first antiferromagnetic layer (e.g., iridium-manganese or platinum-manganese thin film) referred to herein as a pinning layer 34. Pinning layer 34 may be coupled to an artificial antiferromagnet that can include two layers 36, 38 (e.g., cobalt-iron thin films) separated by a ruthenium (Ru) film 40. The first layer 36 is referred to herein as a pinned layer 36 and the second layer 38 is referred to herein as a fixed layer 38. Fixed layer 38 may be fixed to have a reference magnetization 42, $M_{FIX}$, that is established by the properties of pinning layer 34 and pinned layer 36. Free layer 22 is "free" to respond to, i.e., sense, the applied magnetic field (e.g., an external magnetic field) to provide a sense magnetization 44, $M_{FREE}$.

In general, TMR sensor element 20 has a variable resistance in the presence of an external magnetic field. At a fixed voltage, this resistance depends upon the resistance between electrodes 28, 32. Since electrodes 28, 32 are electrically coupled with sense and reference layers 22, 24 respectively, the resistance between electrodes 28, 32 depends upon the alignment of the magnetic moments of the sense and reference layers 22, 24. For example, when the magnetic moments of sense and reference layers 22, 24 are parallel (i.e., the vectors lie along parallel lines and point in the same direction), the resistance of the junction may be at its lowest. However, the resistance of the junction may be at its highest when the magnetic moments are anti-parallel (i.e., the vectors lie along parallel lines but point in the opposite direction). And in between, the resistance of the junction varies as the cosine of the angle between magnetic moments. One or more MTJ structures, such as magnetoresistance sensor element 20, may be utilized for sensing an external magnetic field.

Figure 2:
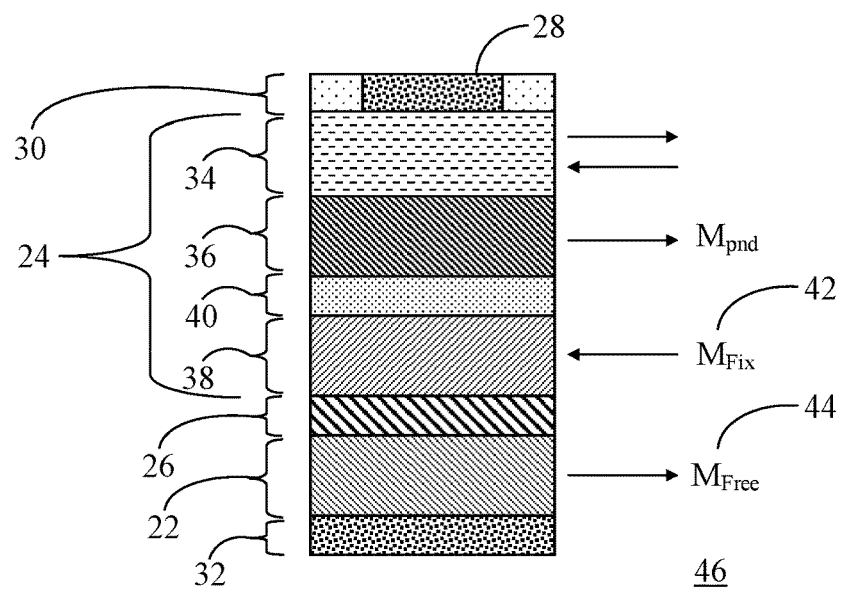
FIG. 2 shows a simplified side view of another example of a TMR sensor element.

FIG. 2 shows a simplified side view of another example of a TMR sensor element 46. In this example, the arrangement of magnetic layers 22, 24 is reversed. Accordingly, TMR sensor element 46 includes magnetic layers 22, 24 separated by junction 26. However, top electrode 28 is in electrical communication with magnetic layer 24 and bottom electrode 32 is in electrical communication with magnetic layer 22.

Again, magnetic layer 22 is the free layer that is "free" to respond to, i.e., sense, the applied magnetic field (e.g., an external magnetic field) to provide sense magnetization 44, $M_{FREE}$. Likewise, magnetic layer 24 is the reference layer having pinning layer 34, pinned layer 36, and fixed layer 38, in which fixed layer 38 is fixed to have a reference magnetization 42, $M_{FIX}$, that is established by the properties of pinning layer 34 and pinned layer 36. It should be understood that more variations are possible. These variations may include, but are not limited to, having pinning layers on top and bottom with different pinning strength, not having separate pinning layers for perpendicular magnetizations, or alternative arrangements of layers as suited for a particular sensor response.

The following FIGS. 3-7 demonstrate prior art methodology for fabrication of TMR sensor elements, such as TMR sensor element 20 (FIG. 1) and TMR sensor element 46 (FIG. 2). As will be discussed below, prior art fabrication methodology can lead to poor product yield and/or poor magnetic performance.

Figure 3:
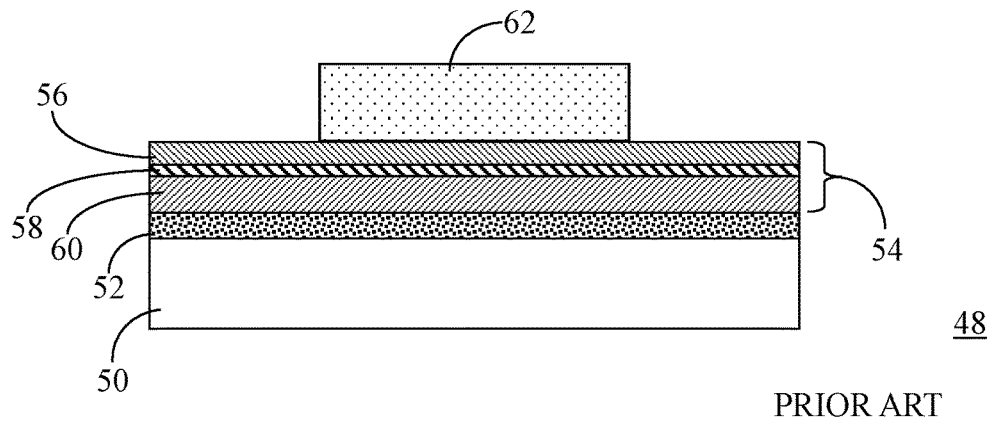
FIG. 3 shows a side sectional view of a structure at an initial stage of processing in accordance with prior art methodology.

FIG. 3 shows a side sectional view of a structure at an initial stage 48 of processing in accordance with prior art methodology. The structure shown in FIG. 3 includes a substrate 50, a bottom electrode layer 52 formed on substrate 50, and a TMR stack 54 formed on bottom electrode layer 52. In this example, TMR stack 54 includes a first magnetic layer 56 (which may be a free layer or a reference layer), a tunnel barrier layer 58, and a second magnetic layer 60 (which may be the other of the free layer or the reference layer). A mask, which may be a hard mask 62, has been deposited and patterned.

Figure 4:
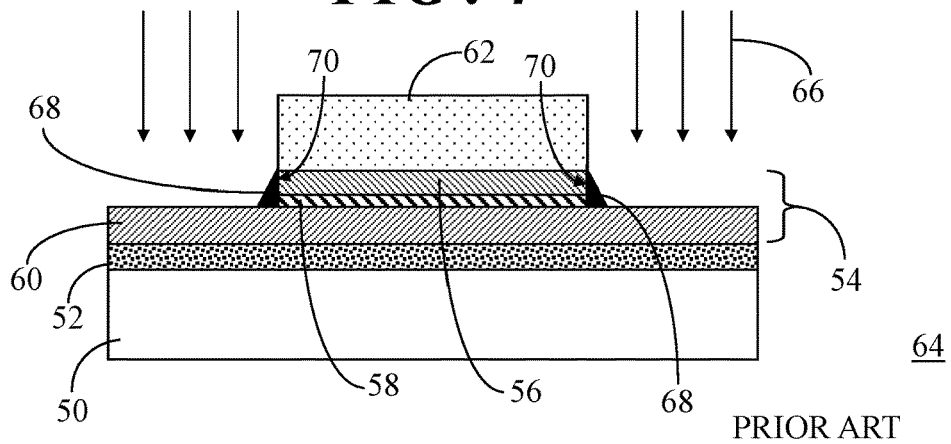
FIG. 4 shows a side sectional view of the structure of FIG. 3 at a subsequent stage of processing in accordance with the prior art methodology.

FIG. 4 shows a side sectional view of the structure of FIG. 3 at a subsequent stage 64 of processing in accordance with the prior art methodology. In general, TMR stack 54 is suitably etched to form individual TMR sensor elements (e.g., TMR sensor elements 20 or 46). Following formation of hard mask 62, prior art methodology typically entails ion beam etching to suitably etch first magnetic layer 56 and tunnel barrier layer 58. Unfortunately, in the case of a small incident angle of an ion beam 66 (i.e., a beam angle that is close to or approximately 90°) relative to the surface of TMR stack 54, re-deposition of metallic particles 68 can occur in response to ion beam etching. These metallic particles 68 may be redeposited at sidewalls 70 of first magnetic layer 56 and tunnel barrier layer 58. Since tunnel barrier layer 58 is an electrically isolating layer, the re-deposition of metallic particles 68 at sidewalls 70 can result in current flow (shorting) from first magnetic layer 56 to second magnetic layer 60 via the redeposited metallic particles 68. Thus, in operation, current flow could bypass tunnel barrier layer 58 resulting in reduced TMR effect.

Figure 5:
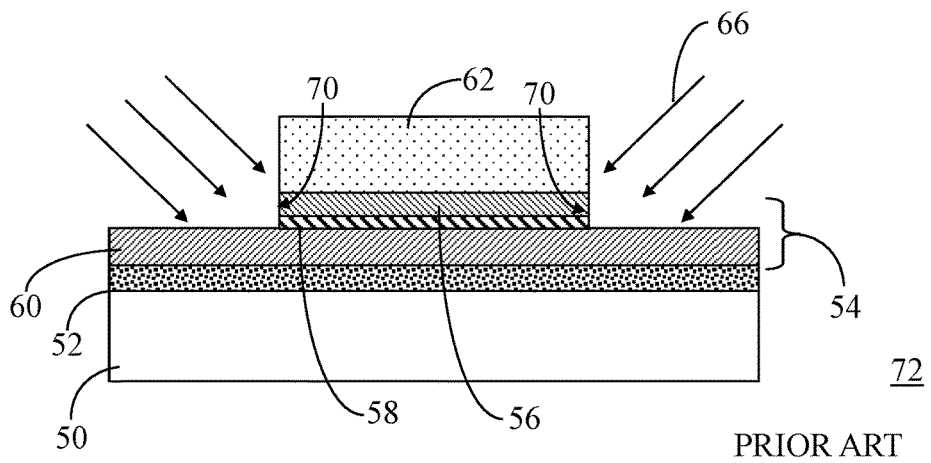
FIG. 5 shows a side sectional view of the structure of FIG. 4 at a subsequent stage of processing in accordance with the prior art methodology.

FIG. 5 shows a side sectional view of the structure of FIG. 4 at a subsequent stage 72 of processing in accordance with the prior art methodology. At subsequent stage 72, another ion beam etch process may be performed at a relatively high incident angle of ion beam 66 (e.g., approximately 30-60°) relative to the surface of TMR stack 54 in order to remove the redeposited metallic particles 68 (FIG. 4). This enables minimization of the presence of redeposited metallic particles 68 at sidewalls 70 thereby reducing the incidence of shorting between first and second magnetic layers 56, 60.

Figure 6:
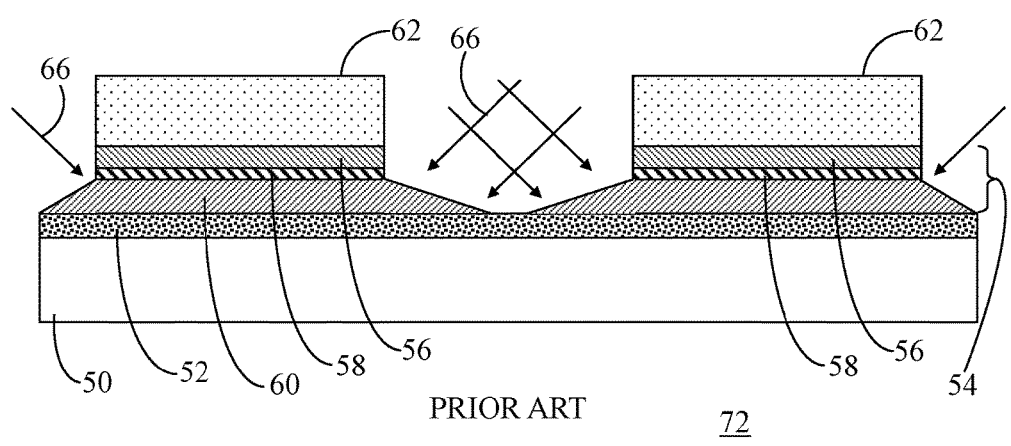
FIG. 6 shows a side sectional view of the structure of FIG. 5 at the subsequent stage of processing shown in FIG. 5 in accordance with the prior art methodology.

Referring now to FIG. 6, FIG. 6 shows a side sectional view of the structure of FIG. 5 at the subsequent stage 72 of processing in accordance with the prior art methodology. Like FIG. 5, FIG. 6 shows the subsequent ion beam etch process performed at the relatively high incident beam angle of ion beam 66. Per convention, multiple TMR sensor elements are likely to be fabricated on substrate 50. Thus, the high incident angle of ion beam 66 can result in etch rate (throughput) reduction and non-uniform etching due to shadowing effects. That is, a non-homogeneous removal of second magnetic layer 60 may occur.

Figure 7:
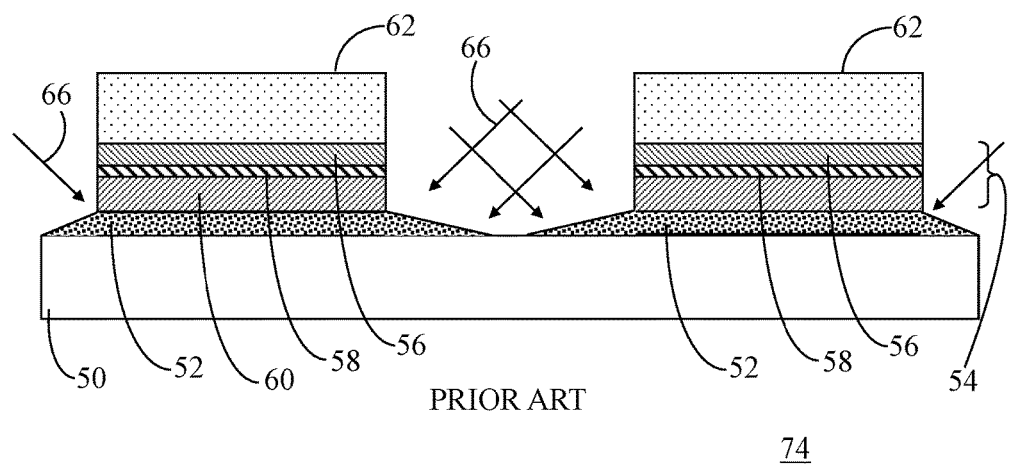
FIG. 7 shows a side sectional view of the structure of FIG. 6 at a subsequent stage of processing in accordance with the prior art methodology.

FIG. 7 shows a side sectional view of the structure of FIG. 5 at a subsequent stage 74 of processing in accordance with the prior art methodology. The continued etching of second magnetic layer 60 at the relatively high incident beam angle of ion beam 66 increases the risk of re-deposition of metallic particles 68 (not shown) from second magnetic layer 60 and shorting between first and second magnetic layers 56, 60. Additionally, bottom electrode layer 52 may be patterned non-uniformly by ion beam 66.

To summarize, FIG. 4 reveals that a small incident angle of ion beam 66 can result in the re-deposition of metallic particles 68 and shorting between the first and second magnetic layers 56, 60 resulting in an undesirably low yield of sensor elements. As shown in FIG. 6, in the case of high incident angle of ion beam 66 with etch stop following removal of tunnel barrier layer 58, a higher TMR effect may be achieved at the expense of non-homogeneous remains of the bottom, second magnetic layer 60. If second magnetic layer 60 is the reference layer 24, including pinning layer 34 as shown in FIG. 1, this could result in a net non-zero magnetic moment of reference layer 24 and disturbance of the free layer 22. Alternatively, if second magnetic layer 60 is the free layer 22, as shown in FIG. 2, this results in a poorly controlled shape of free layer 22 leading to anisotropy variations which can deteriorate the accuracy of the resulting TMR sensor element. Still further and as shown in FIG. 7, complete etch of the bottom, second magnetic layer 60 and metal re-deposition at the tunnel junction can also result in an undesirably low yield. Moreover, a strongly non-uniform pattern of bottom electrode layer 52 may result in local thinning which increases the parasitic resistance which could result in a lower sensor output signal. Methodology, discussed below, alleviates the problems associated with prior art TMR sensor element fabrication techniques to increase yield, reduce manufacturing costs, and enhance magnetic sensor performance.

Figure 8:
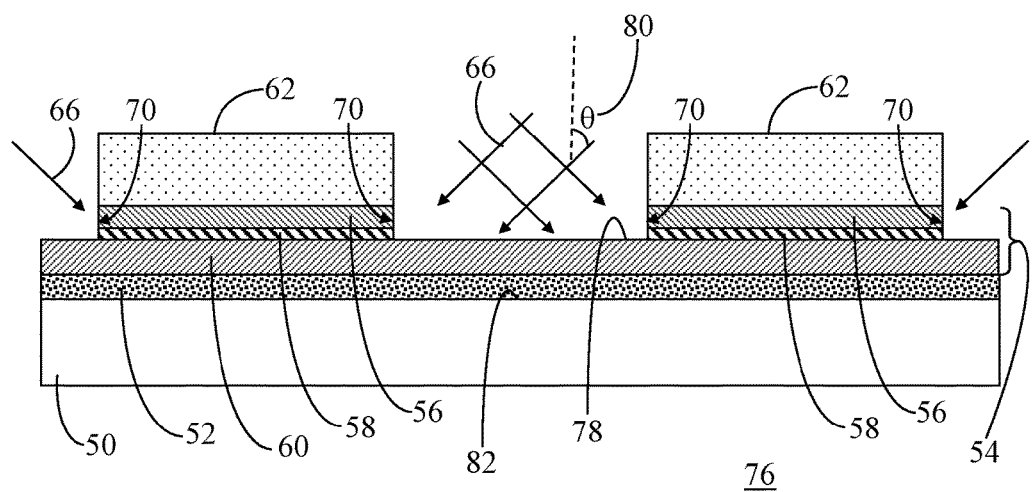
FIG. 8 shows a side sectional view of a structure at an intermediate stage of processing in accordance with an embodiment.

Referring now to FIG. 8, FIG. 8 shows a side sectional view of a structure at an intermediate stage 76 of processing in accordance with an embodiment. The structure shown in FIG. 8 includes substrate 50, bottom electrode layer 52 formed on substrate 50, and TMR stack 54 formed on bottom electrode layer 52. Thus, TMR stack 54 with bottom electrode layer 52 is formed on substrate 50. Again, TMR stack 54 includes first magnetic layer 56 (which may be a free layer or a reference layer), tunnel barrier layer 58, and second magnetic layer 60 (which may be the other of the free layer or the reference layer). A dielectric material has been deposited, patterned, and etched to form hard masks 62 (two shown). At intermediate stage 76, a first etch process is performed with stopping at a top surface 78 of second magnetic layer 60.

In some embodiments, substrate 50 may be an active silicon substrate (i.e., a semiconductor chip having implemented an integrated circuit). As such, the structures of the TMR sensor elements, including their contacting electrodes may be monolithically integrated on top of an active silicon substrate 50 in order to reduce packaging costs, to reduce the number of bond pads, and to enable easier and more accurate matching of the magnetic and electrical elements. An appropriate processing route for monolithic integration consists of performing the TMR processing operations described herein in a CMOS-backend process.

In an embodiment, the first etch process may be a first ion beam etching process. An incident angle 80 of ion beam 66 may be approximately 30-60° from perpendicular to a surface 82 of substrate 50 to minimize re-deposition of metallic particles 68 (FIG. 4) at sidewalls 70. Thus, the first ion beam etching process removes material portions of first magnetic layer 56 and tunnel barrier layer 58 of TMR stack 54, largely leaving second magnetic layer 60 un-etched and therefore intact.

Figure 9:
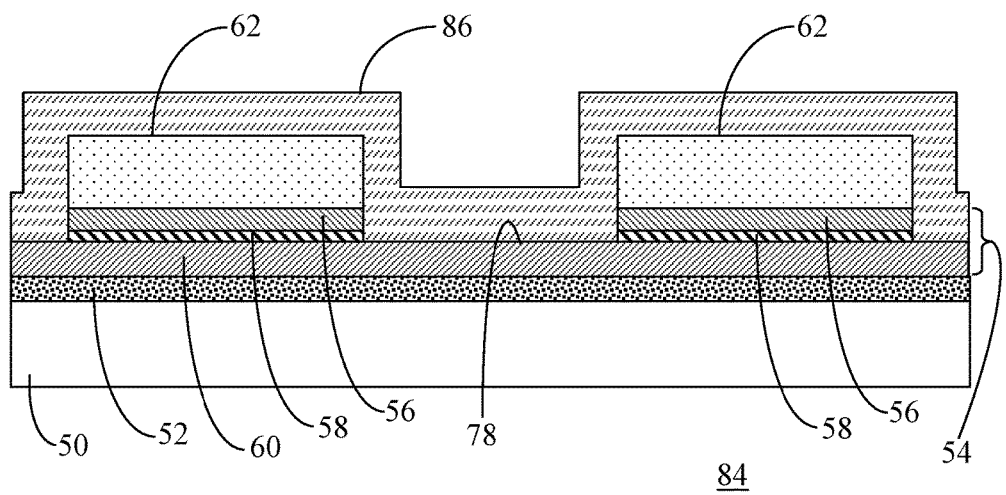
FIG. 9 shows a side sectional view of the structure of FIG. 8 at a subsequent stage of processing.

FIG. 9 shows a side sectional view of the structure of FIG. 8 at a subsequent stage 84 of processing. At stage 84, a protective layer 86 is deposited over TMR stack 54 and top surface 78 of second magnetic layer 60. In this example, protective layer 86 is deposited at a thickness that is sufficient to fully encapsulate TMR stack 54 and hard masks 62. At least one of silicon nitride, silane-based silicon oxide, and a tetraethylorthosilicate (TEOS) oxide material may be utilized to form protective layer 86.

Figure 10:
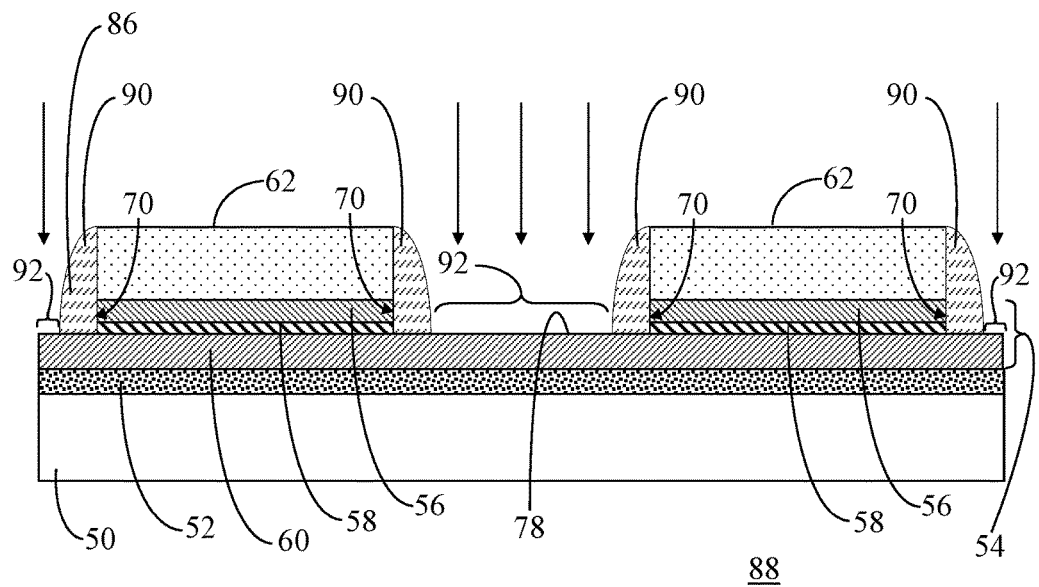
FIG. 10 shows a side sectional view of the structure of FIG. 9 at a subsequent stage of processing.

FIG. 10 shows a side sectional view of the structure of FIG. 9 at a subsequent stage 88 of processing. At stage 88, a second etch process is performed to partially remove protective layer 86. The second etch process may be an anisotropic etch process. In response to the second etch process, a portion 92 of second magnetic layer 60 is exposed from protective layer 86 and spacers 90 are formed from a remaining portion of protective layer 86 that surrounds sidewalls 70 of first magnetic layer 56 and tunnel barrier layer 58. More particularly, following the second etch process, due to the anisotropic etch process, protective layer 86 remains surrounding sidewalls 70 to produce spacers 90 that reside on top surface 78 of second magnetic layer 60 immediately adjacent to sidewalls 70 and extend vertically from top surface 78 to additionally surround hard masks 62.

In an embodiment, the second etch process may be a blanket etch process utilizing, for example, a fluorine chemistry (e.g., $CF_4$) with etch stop on second magnetic layer 60 or end point detection (EPD) on second magnetic layer 60. Alternatively, any suitable etch process may be performed to remove protective layer 86, while producing spacers 90. Still further, an etch process may be performed to remove material portions of protective layer 86 and second magnetic layer 60, as will be discussed below in connection with FIG. 11.

Figure 11:
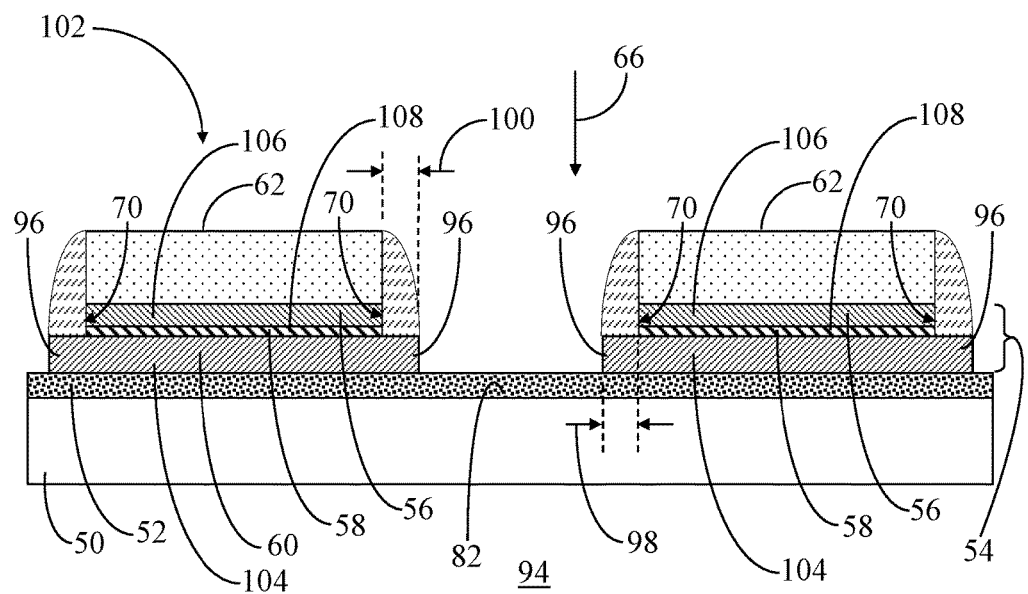
FIG. 11 shows a side sectional view of the structure of FIG. 10 at a subsequent stage of processing.
Figure 12:
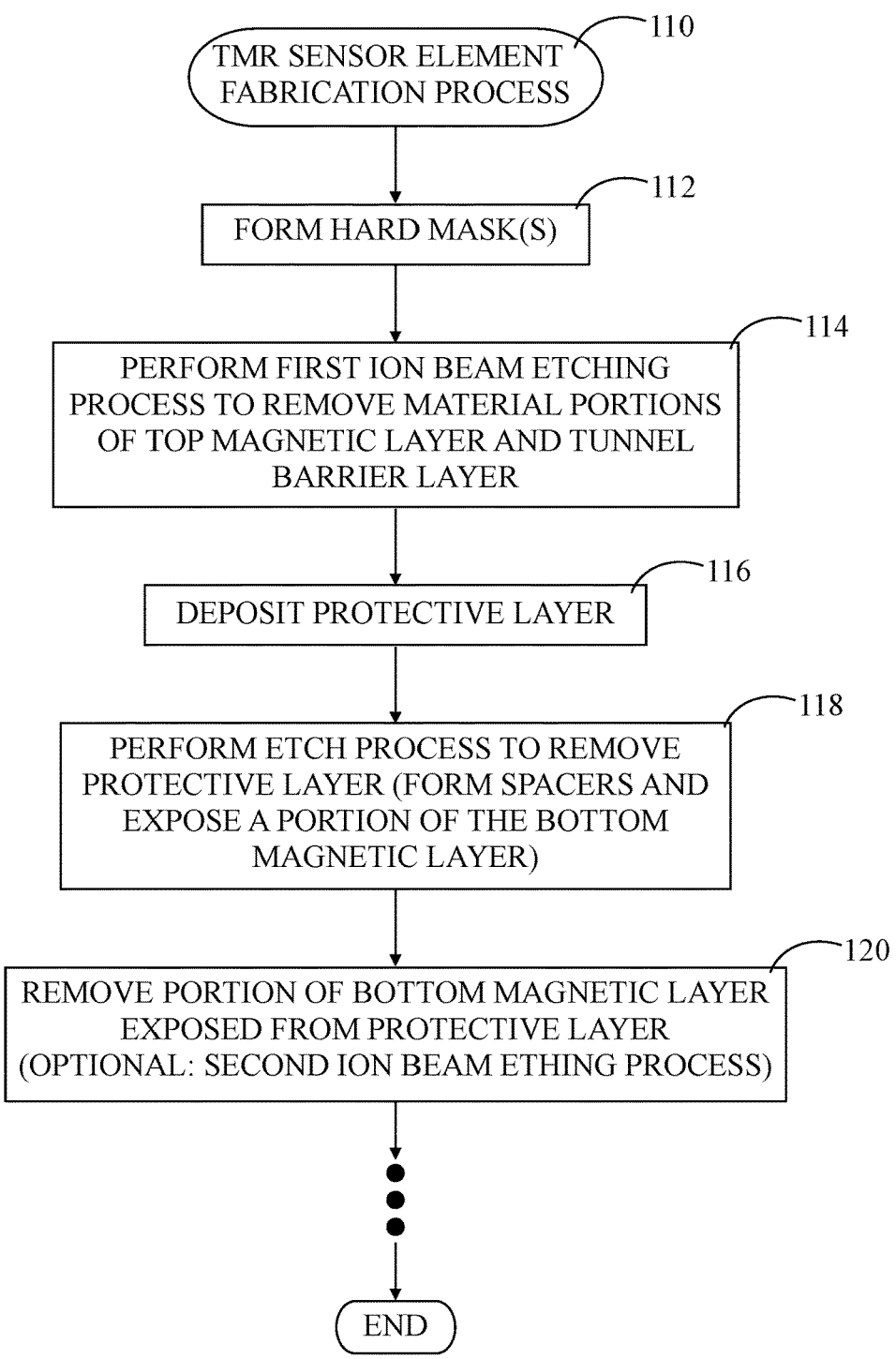
FIG. 12 shows a flow chart of TMR element fabrication in accordance with an embodiment.

FIG. 11 shows a side sectional view of the structure of FIG. 10 at a subsequent stage 94 of processing. At stage 94, portions 92 (FIG. 10) of second magnetic layer 60 that were exposed from protective layer 86 are removed. The presence of spacers 90 enables the utilization of, for example, a third etch process. This third etch process may be a second ion beam etching process in which ion beam 66 is directed at an incident beam angle that is less than ten degrees from perpendicular to surface 82 of substrate 50 to completely remove portions 92 of second magnetic layer 60 that were exposed from protective layer 86 during the second etch process. Alternatively, the second etch process discussed in connection with FIG. 10 may be performed to remove both protective layer 86 and portions 92 of second magnetic layer 60 that are not covered or otherwise protected by spacers 90. The remaining second magnetic layer 60 residing under spacers 90 thus extends laterally relative to first magnetic layer 56 and tunnel barrier layer 58. This extended portion of second magnetic layer 60 is referred to herein as a step region 96, and step region 96 extends laterally relative to first magnet layer 56 and tunnel barrier layer 58 by a distance 98 defined by a lateral width 100 of spacer 90.

During the etch process, spacers 90 protect first magnetic layer 56 and tunnel barrier layer 58 from re-deposition of metallic particles 68 (FIG. 4) to avoid a low TMR effect that could potentially occur by shorting across the tunnel junction. Further, the second ion beam etching process at a small incident beam angle enables the uniform removal of portions 92 of second magnetic layer 60 since there are no shadowing effects. The prevention of shadowing effects minimizes thickness variations of bottom electrode layer 52 (discussed in connection with FIGS. 6-7) and corresponding stress effects. Lateral width 100 of spacers 90 determines the enlargement of second magnetic layer 60 relative to first magnetic layer 56. That is, distance 98 of step region 96 relative to first magnetic layer 56 and tunnel barrier layer 58 can be well-defined by lateral width 100 of protective layer 86 (FIG. 9). For example, distance 98 for step region 96 of twenty nanometers with an accuracy of +/−five nanometers may be achieved for spacers 90 formed from a silicon nitride protective layer 86.

Following removal of portions 92 of second magnetic layer 60, TMR sensor elements 102 remain on surface 82 of substrate 50. Each TMR sensor element 102 includes a bottom magnet 104 (which may be a free or reference layer) formed from second magnetic layer 60 and including step region 96, a top magnet 106 (which may be the other of the free or reference layer) formed from first magnetic layer 56, and a tunnel junction 108 interposed between top and bottom magnets 104, 106 formed from tunnel barrier layer 58. Additionally, spacers 90 remain fully surrounding sidewalls 70 of top magnet 106 and tunnel junction 108. Only two TMR sensor elements 102 are shown in FIG. 11 for simplicity. However, it should be understood that a typical sensor layout consists of a multiplicity of TMR sensor elements 102 electrically connected on a substrate.

A fabrication technique that includes spacers 90 enables second magnetic layer 60 to be uniformly etched. This uniform etching may be crucial when, for example, bottom magnet 104 is the reference layer for TMR element 102. As discussed in connection with FIGS. 1 and 2, the reference layer typically includes the pinned and fixed layers 36, 38. The footprint of the pinned and fixed layers 36, 38 should be the same to avoid any remaining net magnetic moments which could lead to worse magnetic performance. In the case that bottom magnet 104 is the free layer for TMR element 102, a fabrication technique that includes spacers 90 enables proper definition of the geometry of the free layer which can reduce the anisotropy variations that may result from using prior art processes. Further, due to the subsequent etching process after formation of spacers 90, a wide variety of magnetic stacks may be etched uniformly thus enabling the fabrication of, for example, magnetic stacks with two antiferromagnets which may be beneficial for realizing speed sensors with proper cross-sensitivity using TMR technology.

Referring to FIGS. 8-12, FIG. 12 shows a flow chart of TMR element fabrication process 110 in accordance with an embodiment. TMR element fabrication process 110 summarizes the operations described in connection with FIGS. 8-11. Thus, at a block 112, substrate 50 (e.g., wafer) having bottom electrode layer 52 and TMR stack 54 formed thereon (in which TMR stack 54 includes first magnetic layer 56, tunnel barrier layer 58, and second magnetic layer 60). Further, a suitable material (e.g., a dielectric) has been deposited and patterned to form hard masks 62. At a block 114, a first ion beam etching process is performed to remove material portions of the top first magnetic layer 56 and tunnel barrier layer 58 (see FIG. 8) at incident angle 80 of ion beam 66 being in a range of 30-60 degrees. At a block 116, protective layer 86 is deposited over TMR stack 54 (see FIG. 9).

At a block 118, a second etch process is performed to partially remove protective layer 86. In particular, a blanket anisotropic etch process may be performed to form spacers 90 and remove portions of protective layer 86 so as to expose portions 92 of the bottom second magnetic layer 60 from protective layer 86 (see FIG. 10). Again, the second etch process may utilize a fluorine-based chemistry. At a block 120, the exposed portions 92 of the bottom second magnetic layer 60 are removed. Block 120 may be performed in concurrence with etching protective layer 86 at block 118. Alternatively, block 120 may be performed by performing a second ion beam etching process to remove the exposed portions 92 of the bottom second magnetic layer 60. This second ion beam etching process may entail directing ion beam 66 at an incident beam angle that is less than ten degrees from perpendicular to surface 82 of substrate 50 (see FIG. 11) to form TMR sensor elements 102. Ellipses follow block 120 to denote that additional operations may be performed thereafter. Additional operations may entail a separate mask layer and etching operation for patterning bottom electrode layer 52, etching hard masks 62 to form vias and filling the vias with an electrically conductive material to form top electrodes, encapsulation after formation of TMR sensor elements 102, wafer level testing, singulation, and the like. Thereafter, TMR element fabrication process 110 ends.

Embodiments described herein entail tunnel magnetoresistance (TMR) sensor element fabrication methodology and TMR sensor elements fabricated utilizing the methodology. An embodiment of a method comprises performing a first etch process on a substrate having a tunnel magnetoresistance (TMR) stack formed on the substrate, the first etch process removing material portions of a first magnetic layer and a tunnel barrier layer of the TMR stack and stopping at a top surface of a second magnetic layer of the TMR stack. The method further comprises depositing a protective layer over the TMR stack, performing a second etch process to remove the protective layer, wherein in response to the second etch process, a portion of the second magnetic layer is exposed from the protective layer and a spacer is formed from a remaining portion of the protective layer, the spacer surrounding sidewalls of the first magnetic layer and the tunnel junction, and removing the second magnetic layer exposed from the protective layer.

Another embodiment of a method comprises performing a first ion beam etching process on a substrate having a tunnel magnetoresistance (TMR) stack formed on the substrate, the first ion beam etching process removing material portions of a first magnetic layer and a tunnel barrier layer of the TMR stack and stopping at a top surface of a second magnetic layer of the TMR stack. The method further comprises depositing a protective layer over the TMR stack, performing a blanket etch process to remove the protective layer, wherein in response to the blanket etch process, a portion of the second magnetic layer is exposed from the protective layer and a spacer is formed from a remaining portion of the protective layer, the spacer surrounding sidewalls of the first magnetic layer and the tunnel junction, and performing a second ion beam etching process to remove the second magnetic layer exposed from the protective layer.

An embodiment of a tunnel magnetoresistance (TMR) sensor element comprises a bottom magnet formed on a surface of a substrate, a tunnel junction formed on said bottom magnet, a top magnet formed on said tunnel junction, and a spacer fully surrounding sidewalls of said top magnet and said tunnel junction.

Embodiments described herein include nitride or oxide spacer structure that protects the magnetic tunnel junction (MTJ) structure during etching processes. The spacer structure can alleviate problems associated with re-deposition of metallic particles and shorting between the magnetic layers. Additionally, the embodiments enable fast etching of the bottom magnetic layer with a small incident angle of an ion beam thereby increasing the throughput and reducing manufacturing costs. Further, robust TMR patterning is enabled with high yield (high TMR effect) and good magnetic sensor performance due to a well-defined shape of the bottom magnetic layer. As a consequence of the well-defined shape of the bottom magnetic layer, uniform programming of a pinning layer may be enabled on wafer level thereby reducing test costs. Further, the fabrication methodology may achieve a robust and high yield process that enables production of very different magnetic stacks without the addition of further process steps, for improved magnetic sensor performance, reliability, cost savings, and so forth.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method comprising:
performing an ion beam etching process on a tunnel magnetoresistance (TMR) stack formed on an electrode layer, the electrode layer being formed on a surface of a substrate, said ion beam etching process removing material portions of a first magnetic layer and a tunnel barrier layer of said TMR stack and stopping at a top surface of a second magnetic layer of said TMR stack;
depositing a protective layer over said TMR stack;
performing a second etch process to remove said protective layer, wherein in response to said second etch process, a portion of said second magnetic layer is exposed from said protective layer, a section of said electrode layer is interposed between said surface of said substrate and said portion of said second magnetic layer, and a spacer is formed from a remaining portion of said protective layer, said spacer surrounding sidewalls of said first magnetic layer and said tunnel barrier layer; and
removing said portion of said second magnetic layer exposed from said protective layer, wherein said section of said electrode layer remains on said surface of said substrate following said performing and removing operations, said section of said electrode layer extending laterally on said surface of said substrate beyond said second magnetic layer such that said section of said electrode layer is exposed from said second magnetic layer.

2. The method of claim 1 wherein said performing said ion beam etching process comprises directing an ion beam at an incident beam angle in a range of 30-60 degrees from perpendicular to a surface of said substrate.

3. The method of claim 1 wherein said depositing comprises utilizing at least one of a silicon nitride, silane-based silicon oxide, and a tetraethylorthosilicate (TEOS) oxide material to form said protective layer.

4. The method of claim 1 wherein said performing said second etch process comprises performing an anisotropic etch process.

5. The method of claim 1 wherein said performing said second etch process comprises utilizing a fluorine-based chemistry.

6. The method of claim 1 wherein said second etch process is performed to remove both of said protective layer and said second magnetic layer exposed from said protective layer.

7. The method of claim 6 wherein said second etch process is a second ion beam etching process, wherein said second ion beam etching process comprises directing an ion beam at an incident beam angle that is less than ten degrees from perpendicular to said surface of said substrate.

8. The method of claim 1 wherein said removing operation comprises performing a third etch process following said second etch process.

9. The method of claim 8 wherein said third etch process is a second ion beam etching process, wherein said second ion beam etching process comprises directing an ion beam at an incident beam angle that is less than ten degrees from perpendicular to said surface of said substrate.

10. The method of claim 1 wherein following said removing operation, a TMR sensor element remains on said substrate, said TMR sensor element including a bottom magnet formed from said second magnetic layer, a top magnet formed from said first magnetic layer, a tunnel junction interposed between said bottom and top magnets and formed from said tunnel barrier layer, and an electrode formed from said electrode layer and interposed between said bottom magnet and said surface of said substrate.

11. The method of claim 10 wherein following said removing, said bottom magnet includes a step region that extends laterally relative to said top magnet and said tunnel junction by a distance defined by a lateral width of said spacer, and said spacer resides on said step region.

12. The method of claim 1 wherein said substrate is an active silicon substrate.

13. A method comprising:
performing a first ion beam etching process on a tunnel magnetoresistance (TMR) stack formed on an electrode layer, the electrode layer being formed on a surface of a substrate, said first ion beam etching process removing material portions of a first magnetic layer and a tunnel barrier layer of said TMR stack and stopping at a top surface of a second magnetic layer of said TMR stack;
depositing a protective layer over said TMR stack;
performing an anisotropic etch process to remove said protective layer, wherein in response to said anisotropic etch process, a portion of said second magnetic layer is exposed from said protective layer, a section of said electrode layer is interposed between said surface of said substrate and said portion of said second magnetic layer, and a spacer is formed from a remaining portion of said protective layer, said spacer surrounding sidewalls of said first magnetic layer and said tunnel barrier layer; and
performing a second ion beam etching process to remove said portion of said second magnetic layer exposed from said protective layer, wherein said section of said electrode layer remains on said surface of said substrate following said performing and removing operations, said section of said electrode layer extending laterally on said surface of said substrate beyond said bottom magnetic layer such that said section of said electrode layer is exposed from said second magnetic layer.

14. The method of claim 13 wherein:
said performing said first ion beam etching process comprises directing an ion beam at an incident beam angle in a range of 30-60 degrees from perpendicular to said surface of said substrate; and
said performing said second ion beam etching process comprises directing an ion beam at an incident beam angle that is less than ten degrees from perpendicular to said surface of said substrate.

15. The method of claim 13 wherein said performing said anisotropic etch process comprises utilizing a fluorine-based chemistry.

* * * * *